(12) United States Patent
Lee

(10) Patent No.: US 8,872,545 B2
(45) Date of Patent: Oct. 28, 2014

(54) EXCLUSIVE OR CIRCUIT

(75) Inventor: Joong Ho Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 192 days.

(21) Appl. No.: 13/604,548

(22) Filed: Sep. 5, 2012

(65) Prior Publication Data

US 2013/0265082 A1  Oct. 10, 2013

(30) Foreign Application Priority Data

Apr. 5, 2012  (KR) ........................ 10-2012-0035390

(51) Int. Cl.
*H03K 19/21*  (2006.01)

(52) U.S. Cl.
USPC ............... 326/55; 326/113; 326/121

(58) Field of Classification Search
USPC .................................... 326/52–55
See application file for complete search history.

(56) References Cited

U.S. PATENT DOCUMENTS 5,334,888 A * 8/1994 Bodas .............................. 326/54
8,653,857 B2 * 2/2014 Becker .......................... 326/113
2010/0141299 A1 * 6/2010 Moon .............................. 326/55

FOREIGN PATENT DOCUMENTS

KR  10-2010-0066790 A  6/2010

* cited by examiner

*Primary Examiner* — Jany Richardson
(74) *Attorney, Agent, or Firm* — William Park & Associates Patent Ltd.

(57) ABSTRACT

An exclusive OR circuit includes, inter alia: a low pass unit configured to apply a second data to an output node when a first data is at a low level and to apply the first data to the output node when the second data is at a low level, and a discharge unit configured to discharge a voltage level of the output node when the first and second data are at a high level.

6 Claims, 1 Drawing Sheet

EXCLUSIVE OR CIRCUIT

CROSS-REFERENCES TO RELATED APPLICATION

The present application claims priority under 35 U.S.C. §119(a) to Korean application number 10-2012-0035390 filed on Apr. 5, 2012, in the Korean Intellectual Property Office, which is incorporated herein by reference in its entirety.

BACKGROUND

1. Technical Field

The present invention relates generally to semiconductor design technology, and more particularly, to an exclusive OR circuit.

2. Related Art

A semiconductor apparatus is designed using a plurality of logic circuits. Among the plurality of logic circuits, an exclusive OR circuit may be widely used in the circuit design field in areas such as data parity bit schemes, particularly Error Correcting Code (ECC) and Cyclical Redundancy Check (CRC), in order to increase reliability. Such a circuit may also be applied to various design fields such as Application Specific Integrated Circuits (ASIC), communication design, graphic DRAM, as well as DRAM.

FIG. 1 is a diagram illustrating a unit circuit diagram of a conventional exclusive OR circuit.

The conventional exclusive OR circuit includes a first OR gate OR1, a first NAND gate ND1, and a first AND gate AD1.

The first OR gate OR1 and the first NAND gate ND1 are configured to receive first and second data A and B and perform the corresponding logic operation on the received data.

The first AND gate AD1 is configured to perform a logic operation on outputs of the first OR gate OR1 and the first NAND gate ND1 and output the operation result as final data C.

The exclusive OR circuit receives the first and second data A and B and obtains the following operation results.

| First data A | Second data B | Final data C |
| --- | --- | --- |
| 0 | 0 | 0 |
| 0 | 1 | 1 |
| 1 | 0 | 1 |
| 1 | 1 | 0 |

The circuit illustrated in FIG. 1 operates as a general exclusive OR circuit which outputs a high level when two complementary data are received.

Semiconductor apparatuses have developed according to is the trend of low voltage, high integration, and small size. However, since the above-described exclusive OR circuit includes a large number of transistors, the design efficiency decreases. For example, the area of a semiconductor chip may be increased, or the data processing time may be delayed.

SUMMARY

In an embodiment of the present invention, an exclusive OR circuit includes a low pass unit and a discharge unit. The low pass unit is configured to apply a second data to an output node when a first data is at a low level, and to apply the first data to the output node when the second data is at a low level. The discharge unit is configured to discharge a voltage level of the output node when both the first and second data are at a high level.

In an embodiment of the present invention, an exclusive OR circuit includes a low pass unit, a high pass unit, and a discharge unit. The low pass unit is configured to apply a second data to an output node when a first data is at a low level, and to apply the first data to the output node when the second data is at a low level. The high pass unit is configured to output the second data as a discharge signal when the first data is at a high level, and to output the first data as the discharge signal when the second data is at a high level. The is discharge unit is configured to discharge a voltage level of the output node in response to the discharge signal.

In yet an embodiment of the present invention, an exclusive OR circuit includes first to fifth transistors. A first transistor has a source-drain path between a first input terminal and an output node and has a gate connected to a second input terminal. A second transistor has a source-drain path between the second input terminal and the output node and has a gate connected to the first input terminal. A third transistor has a source-drain path between the first input terminal and a control node and has a gate connected to the second input terminal. A fourth transistor has a source-drain path between the second input terminal and the control node and has a gate connected to the first input terminal. A fifth transistor has a source-drain path between the output node and ground, and has a gate connected to the control node.

BRIEF DESCRIPTION OF THE DRAWINGS

Features, aspects, and embodiments are described in conjunction with the attached drawings, in which.

DETAILED DESCRIPTION

Hereinafter, an exclusive OR circuit according to the present invention will be described below with reference to the accompanying drawings through various embodiments.

Figure 1:
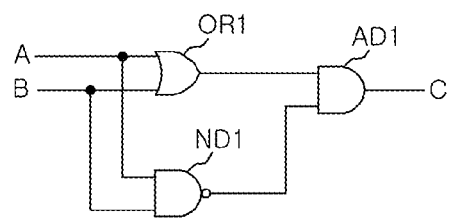
FIG. 1 is a diagram illustrating a unit circuit diagram of a conventional exclusive OR circuit.
Figure 2:
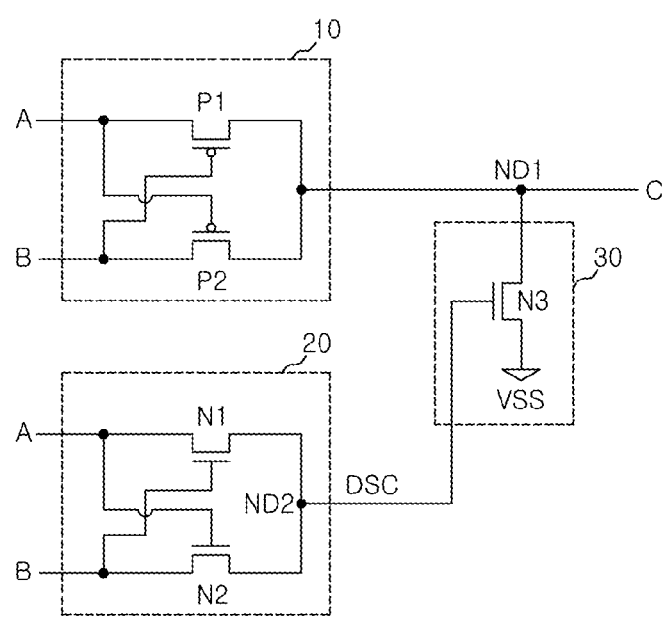
FIG. 2 is a unit circuit diagram of an exclusive OR circuit according to one embodiment of the present invention.

FIG. 2 is a unit circuit diagram of an exclusive OR circuit according to an embodiment of the present invention.

The exclusive OR circuit illustrated in FIG. 2 may be widely applied to a communication design field as well as various memory apparatuses including DRAM, among others.

The exclusive OR circuit according to the embodiment of the present invention includes a low pass unit 10, a high pass unit 20, and a discharge unit 30.

The low pass unit 10 is configured to apply second data B to an output node ND1 thereof, when first data A received through a first input terminal is at a low level, and to apply the first data A to the output node ND1 when the second data B received through a second input terminal is at a low level.

In contrast, the high pass unit 20 is configured to apply the second data B to a control node ND2 when the first data A received through the first input terminal is at a high level, and to apply the first data A to the control node ND2 when the second data B received through the second input terminal is at a high level. The voltage level applied to the control node ND2 by the high pass unit 20 is used as a discharge signal DSC to control the discharge unit 30.

The discharge unit 30 is configured to discharge the voltage level of the output node ND1 in response to the discharge signal DSC.

As a result, the voltage level of the output node ND1 is decided by the discharge charge unit 30 with reference to the low pass unit 10 and the high pass unit 20. The voltage level of the output node ND1 is transferred as the final data C.

The operation of the exclusive OR circuit according to the embodiment of the present invention will be described as follows.

When both of the first and second data A and B are at a low level, the low-level first and second data A and B are applied to the output node ND1 by the low pass unit 10. Therefore, the final data C has a low output level.

When the first and second data A and B are at complementary levels, high-level data is applied to the output node ND1 by the first low pass unit 10, and the discharge unit 30 is turned off. Therefore, the final data C has a high output level.

When both of the first and second data A and B are at a high level, the high pass unit 20 generates the high-level discharge signal DSC. Since the discharge charge unit 30 discharges the output node ND1 to a ground voltage VSS, the final data C has a low output level.

The exclusive OR circuit according to the embodiment of the present invention may be implemented with CMOS transistors.

For example, as illustrated in FIG. 2, the low pass unit 10 may include two PMOS transistors P1 and P2. The first PMOS transistor P1 forms a source-drain path between the output node ND1 and the first input terminal receiving the first data A, and has a gate is connected to the second input terminal receiving the second data B. Similarly, the second PMOS transistor P2 forms a source-drain path between the output node ND1 and the second input terminal receiving the second data B, and has a gate connected to the first input terminal receiving the first data A.

The high pass unit 20 may include two NMOS transistors N1 and N2. The first NMOS transistor N1 forms a source-drain path between the control node ND2 and the first input terminal receiving the first data A, and has a gate connected to the second input terminal receiving the second data B. Similarly, the second NMOS transistor N2 forms a source-drain path between the control node ND2 and the second input terminal receiving the second data B, and has a gate connected to the first input terminal receiving the first data A.

The discharge unit 30 may include an NMOS transistor N3. The third NMOS transistor N3 forms a source-drain path between the output node ND1 and the ground VSS, and has a gate connected to the control node ND2.

The operation of the exclusive OR circuit implemented with CMOS transistors is performed as follows.

When both of the first and second data A and B are at a low level, the first and second PMOS transistors P1 and P2 are turned on to apply the low-level first and second data A and B to the output node ND1. Therefore, the final data C has a low output level.

When the first and second data A and B are at is complementary levels, any one of the first and second PMOS transistors P1 and P2 is turned on to apply high-level data to the output node ND1. In addition, any one of the first and second NMOS transistors N1 and N2 is turned on to apply the low-level discharge signal DSC to the control node ND2. Since the third NMOS transistor N3 is turned off by the low-level discharge signal DSC, the final data C has a high output level.

When both the first and second data A and B are at a high level, the first and second NMOS transistors N1 and N2 are turned on to apply the high-level first and second data A and B to the control node ND2. Therefore, the high-level discharge signal DSC is generated, and the third NMOS transistor N3 is turned on by the discharge signal DSC. Accordingly, the final data C has a low output level.

While certain embodiments have been described above, it will be understood to those skilled in the art that the embodiments described are by way of example only. Accordingly, the exclusive OR circuit described herein should not be limited based on the described embodiments. Rather, the exclusive OR circuit described herein should only be limited in light of the claims that follow when taken in conjunction with the above description and accompanying drawings.

What is claimed is:

1. An exclusive OR circuit comprising:
    a low pass unit configured to apply a second data to an output node when a first data is at a low level, and to apply the first data to the output node when the second data is at a low level;
    a high pass unit configured to output the second data as a discharge signal when the first data is at a high level, and to output the first data as the discharge signal when the second data is at a high level; and
    a discharge unit configured to discharge a voltage level of the output node in response to the discharge signal.

2. The exclusive OR circuit according to claim 1, wherein the discharge unit discharges the voltage level of the output node when the discharge signal is at a high level.

3. An exclusive OR circuit comprising:
    a first transistor forming a source-drain path between a first input terminal and an output node and having a gate connected to a second input terminal;
    a second transistor forming a source-drain path between the second input terminal and the output node and having a gate connected to the first input terminal;
    a third transistor forming a source-drain path between the first ut terminal and a control node and having a gate connected to the second input terminal;
    a fourth transistor forming a source-drain path between the second input terminal and the control node and having a gate connected to the first input terminal; and
    a fifth transistor forming a source-drain path between the output node and a ground, and having a gate connected to the control node.

4. The exclusive OR circuit according to claim 3, wherein the first and second transistors are PMOS transistors, and the third to fifth transistors are NMOS transistors.

5. A circuit capable of performing a logic operation comprising:
    a low pass unit configured to apply a second data to an output node when a first data is at a low level, and to apply the first data to the output node when the second data is at a low level;
    a high pass unit configured to output the second data as a discharge signal when the first data is at a high level, and to output the first data as the discharge signal when the second data is at a high level; and
    a discharge unit configured to discharge a voltage level of the output node in response to the discharge signal.

6. The circuit according to claim 5, wherein the discharge unit outputs the voltage level of the output node when the discharge signal is at a high level.

* * * * *